(12) United States Patent
Suzuki

(10) Patent No.: US 7,650,582 B2
(45) Date of Patent: Jan. 19, 2010

(54) CIRCUIT ANALYSIS DEVICE ALLOWING MORE ACCURATE ANALYSIS OF SIGNAL PROPAGATION DELAY IN CIRCUIT REPRESENTATION OF A HIGHLY ABSTRACT LEVEL

(75) Inventor: Katsuharu Suzuki, Tokyo (JP)

(73) Assignee: NEC Corporation (JP)

( * ) Notice: Subject to any disclaimer, the term of this patent is extended or adjusted under 35 U.S.C. 154(b) by 336 days.

(21) Appl. No.: 11/753,467

(22) Filed: May 24, 2007

(65) Prior Publication Data

US 2007/0276617 A1 Nov. 29, 2007

(30) Foreign Application Priority Data

May 29, 2006 (JP) .............................. 2006-148154

(51) Int. Cl.
*G06F 17/50* (2006.01)
(52) U.S. Cl. .................................... 716/6; 716/4; 716/5
(58) Field of Classification Search .................. 716/4–6
See application file for complete search history.

(56) References Cited

U.S. PATENT DOCUMENTS

| 4,263,651 | A | 4/1981 | Donath et al. ................ 364/300 |
| 6,430,731 | B1 * | 8/2002 | Lee et al. ........................ 716/6 |
| 7,007,263 | B2 * | 2/2006 | Yang et al. ..................... 716/18 |

FOREIGN PATENT DOCUMENTS

| JP | 5-242183 | 9/1993 |
| JP | 5-242184 | 9/1993 |
| JP | 8-288395 | 11/1996 |
| JP | 11-96203 | 4/1999 |

OTHER PUBLICATIONS

Hitchcock, Robert B., "Timing Verification and the Timing Analysis Program", IBM General Technology Division, 19th Design Automation Conference, IEEE, Paper 34.2, pp. 594-604.

(Continued)

*Primary Examiner*—Jack Chiang
*Assistant Examiner*—Brandon W Bowers
(74) *Attorney, Agent, or Firm*—Hayes Soloway P.C.

(57) ABSTRACT

The present invention provides a circuit analysis device including: storage unit having stored therein: connection information about multiple components; delay information including information about the delay time of a discrete component and a chain delay time which is a delay time in the case in which a chain delay effect is generated by a connection with another component about each kind of the multiple components; and chain effect propagating component information including information about kinds of chain effect propagating components which are components for transmitting the chain delay effect, and data processing unit for: referring to the information stored in the storage unit; performing a total delay time calculation process of sequentially adding the delay times of the components along a signal path in the circuit; and if the chain effect propagating component is halfway through the signal path in the total delay time calculation process, examining a connection relation between components that precede and follow the chain effect propagating component and determining a delay time of the component that follows the chain effect propagating component that corresponds to the connection relations.

27 Claims, 13 Drawing Sheets

OTHER PUBLICATIONS

Sivaraman et al., "Cycle-time Aware Architecture Synthesis of Custom Hardware Accelerators", Cases 2002, Oct. 8-11, 2002, Hewlett-Packard Labs, 2002, pp. 35-42.

Note et al., "Combined Hardware Selection and Pipelining in High-Performance Data-Path Design", IEE Log No. 9104580, IEEE Transactions on Computer-Aided Design, vol. 11, No. 4, Apr. 1992.

* cited by examiner (a)    (b)

delay information information about a chain effect propagating component

CIRCUIT ANALYSIS DEVICE ALLOWING MORE ACCURATE ANALYSIS OF SIGNAL PROPAGATION DELAY IN CIRCUIT REPRESENTATION OF A HIGHLY ABSTRACT LEVEL

This application is based upon and claims the benefit of priority from Japanese Patent Application No. 2006-148154 filed on May 29, 2006, the content of which is incorporated by reference.

BACKGROUND OF THE INVENTION

1. Field of the Invention

The present invention relates to a circuit analysis device for analyzing delay time for a digital circuit including a wiring that bundles multiple bits, a circuit analysis method thereof and a program for causing a computer to execute the method.

2. Description of the Related Art

As semiconductor process technology progresses, the design scale of digital circuits is becoming larger and complexity of digital circuits is increasing year after year. There is also increasingly stronger demand for a technology that will ensure at the initial design stage that, taking into consideration the design scale and complexity of the circuit, the digital circuit will operate correctly after manufacturing. As for a synchronous digital circuit which is currently in the mainstream, processing is performed while synchronizing the circuit by means of a periodic pulse signal called a clock. Therefore, it is necessary to always finish a unit operation of the circuit in a time period equivalent to one clock period. To assure that a designed circuit correctly operates after manufacturing, there is a generally used technique called Static Timing Analysis (STA) for analyzing the maximum operating frequency of the circuit in a design stage.

The STA is a technique for analyzing delay time of a path in a circuit where the operation must be completed within a given time period, such as a clock period or a time period which is an integral multiple thereof. The STA can execute a delay analysis by taking less time than a delay simulation that is conventionally used. The path which requires the operation to be completed within a given time period is generally a path leading from an external input terminal to a memory unit or a path leading from the memory unit to an external output terminal in the circuit. If the reference time is the time for transmitting a signal from the origin to an end direction of the path as a subject of the delay analysis, the delay time is analyzed by estimating the signal arrival time to the components existing on the path.

An example of a conventional circuit design system is described in U.S. Pat. No. 4,263,651 (hereinafter, referred to as Document 1) and Robert B. Hitchcock Sr., "Timing Verification and the Timing Analysis Program," Proceedings of 19$^{th}$ Design Automation Conference, pp. 594 to 604 (hereinafter, referred to as Document 2). FIG. 1 is a block diagram showing a configuration example of the conventional circuit design system.

As shown in FIG. 1, the conventional circuit design system includes input device 500 as input means, data processing device 510, storage device 520 and output device 530 as output means. Data processing device 510 is configured to include circuit input means 511, delay analysis means 512 and result output means 513. Hereunder, operations of the conventional circuit design system will be briefly described.

If connection information 521 indicating the relationship of the connected components of a logic circuit is inputted via input device 500, data processing device 510 transfers connection information 521 to storage device 520 to store it therein. In general, connection information 521 about the logic circuit is described by using a hardware description language or the like, where the components constituting the circuit and connection relations among components are defined. Next, if delay information 522 indicating the delay time of each of the components existing in the circuit is inputted, data processing device 510 transfers delay information 522 to storage device 520 to store it therein. Data processing device 510 calculates the longest path out of the path leading from the external input terminal to the memory unit or the path leading from the memory unit to the external output terminal in the circuit with reference to delay information 522 about each of the components. There are many proposed methods of efficiently calculating the longest path, which are disclosed in Document 1 for instance. It is thereby possible to acquire the longest signal path.

Subsequently, data processing device 510 calculates the delay of the circuit according to the STA technique. Here, the one of general operations of the STA technique will be described. The delay time of each of the components constituting the circuit is measured in advance, and is stored in storage device 520 as described above. Based on the information about the connection relations among the components of the circuits, the signal arrival time is acquired about each of the components on the path from the origin, such as the external input terminal, to the end, such as an external output terminal and a register. As for the components that receive signals from each of the multiple paths, the latest signal arrival time from the origin is employed so as to pass the employed signal arrival time to a next component. Thus, the latest arrival times of the signal at the terminals of the circuit are passed on to the following component in turn to estimate the signal arrival time at the end. In this case, it is possible to determine the signal with the latest arrival time in the entire circuit at high speed by referring to the longest signal path acquired.

The STA technique has been implemented for circuit representations of an abstract level called a gate level, where logic gates of a small number of inputs are circuit components. As for the circuits of the gate level, the wire connections among the circuit components corresponds to one physical wiring, and there is no assumption about a signal line called a bus which is a bundle of multiple signal lines of semantic coherence. The bus transmits signals of a bit count having a fixed width in parallel. In the case of the circuits of the gate level, the delay time of a circuit component is generally only determined by the circuit component, which is not dependent on what path the signal has followed to arrive at the circuit component. As for the related STA technique, it is presumed that the delay time of the path depends on the delay time of the components on the path but does not depend on the wiring configuration.

In recent years, as the circuit scale becomes larger and more complicated, circuit design is implemented at a level called an RT (Register Transfer) level which is a more abstract level than the gate level. Thus, a high-speed delay-analysis at the RT level is required. Especially, in the case of behavioral synthesis CAD (Computer Aided Design) for automatically synthesizing a circuit of the RT level with behavioral description in C named software language as the input, high-speed execution of the STA at the RT level is required because an optimal circuit must be searched for while generating and evaluating a large number of the circuits of the RT level.

As for the circuit components in the case of the RT level, circuit configuration is represented by larger-scale components called a functional unit and a selector and connections thereof in addition to basic logic devices. Even when multiple bit lines are inputted in parallel, the multiple bit lines are bundled and described as one signal line. Therefore, there are cases where multiple signal lines are physically used even though the connection of components is one connection in terms of the circuit representation. A delay estimation error may thereby be generated.

There is a chain delay effect as one of the causes of the delay estimation error in the case of the RT level. "Chain" means to mutually connect the components which input and output the signals in series for bundling the bit lines without putting the memory unit between them. The chain delay effect refers to a phenomenon in which the entire component group chained as above has a different delay time value from the value acquired by adding the delay time of separate components as to all the chained components. The chain delay effect is disclosed in Japanese Patent Laid-Open No. 11-96203 (hereinafter, referred to as Document 3) and Mukund Sivaraman, Shail Aditya, "Cycle-time Aware Architecture Synthesis of Custom Hardware Accelerators," Proceedings of the 2002 international conference on Compilers, architecture and synthesis for embedded systems, pp. 35 to 42 (hereinafter, referred to as Document 4). Hereunder, chain delay time refers to the delay time estimated for one of the components when the chain delay effect is generated by connecting two components.

The chain delay effect will be described by using an example of a chain connection of carry-propagate adders. FIG. 2 is a diagram showing a circuit example of the chain connection according to carry-propagate adders. FIG. 2($a$) shows a representation at the RT level, and FIG. 2($b$) shows a circuit representation at the gate level. Hereunder, the carry-propagate adders are simply called adders.

The circuit shown in FIG. 2($a$) has 4-bit adders 551 and 552 serially connected in two stages. The discrete delay time of adders 551 and 552 was 4d by measurement. The delay times of 1-bit addition gates 553, represented as one blocks in FIG. 2($b$), are uniformly d. As shown in FIG. 2($b$), the longest signal path of the entire circuit is the path indicated by a dotted line, and the longest delay time is 5d. In the case of implementing the STA in the circuit at the RT level, the delay time of the circuit is acquired as 4d+4d=8d because adders 551 and 552 whose delay time is 4d are connected in two stages. As is evident from this result, if the delay time is sought, based on the STA technique, as to the circuit at the RT level, it includes a significant error against 5d which is an STA result at the gate level.

As for delay information about the components in view of the chain delay effect, the delay time should be measured in advance with the components, that have the chain delay effect, connected in series with other components so as to store the delay information in storage device 520 apart from delays of the discrete components. This is reasoned by analogy with Stefaan Note, Francky Catthoor, Gert Goossens, Hugo De Man, "Combined Hardware selection and Pipelining in High Performance Data-Path Design," IEEE Transactions on Computer-Aided Design, vol. 9, pp. 413 to 423, April 1992 (hereinafter, referred to as Document 5).

However, there are the cases where the delay cannot be correctly measured even by combining the technique reasoned by analogy in Document 5 with the above-mentioned general STA technique. It is because the chain delay effect which is generated by the connection relation of two components also occurs in the case where a different kind of component is put between the components. An example thereof will be described below.

FIG. 3 is a diagram showing an example of connecting another component between the serially connected adders in two stages. As shown in FIG. 3, multiplexer 555 is connected as another kind of component between adders 551 and 552. At the gate level, multiplexer 555 has a structure in which the components of the same logic are arranged in parallel at each bit. In the circuit at the RT level shown in FIG. 3($a$), the chain delay effect exists due to the mutual connection of the adders although adders 551 and 552 are not connected in series.

The general STA technique is based on the premise that a delay of the component in a given circuit is generally independent of the path. It is possible, by referring to the component and a component connected immediately before it, to consider the chain delay effect according to the related STA technique described above. In the case where the chain delay effect exists between components not directly connected, however, the arrival time of the signal component existing on the path between the components depends on the path. Therefore, the latest path of the arrival time of the signal component cannot be determined only from the component existing on the origin side. Thus, the delay time of such a circuit cannot be correctly measured except by an inefficient method such as counting all the paths existing in the circuit.

SUMMARY OF THE INVENTION

It is an object of the present invention to provide a circuit analysis device capable of more accurately analyzing a signal propagation delay of a circuit at an RT level which is more abstract than at a gate level, a circuit analysis method thereof and a program for causing a computer to execute the method.

According to the present invention, a circuit analysis device for acquiring a signal delay time at a Register Transfer level of a circuit including multiple components, comprises a storage unit for storing: connection information including information about kinds and numbers of the multiple components and connection relations among components; delay information including information about a delay time of a discrete component and a chain delay time which is a delay time in a case in which a chain delay effect is generated by a connection with another component about each kind of the multiple components; and chain effect propagating component information including information about kinds of chain effect propagating components which are components for transmitting the chain delay effect, and a data processing unit for: when inputting the connection information, the delay information about each kind of the multiple components and the chain effect propagating component information, storing these kinds of information in the storage unit; referring to information stored in the storage unit; performing a total delay time calculation process of sequentially adding delay times of components along a signal path in the circuit; and if the chain effect propagating component is halfway through a signal path in a total delay time calculation process, examining a connection relation between components that precede and follow the chain effect propagating component and determining a delay time of the component that follows the chain effect propagating component that corresponds to the connection relations.

According to the circuit analysis device of the present invention, if there is a chain effect propagating component halfway through a path when calculating total delay time, it is determined whether or not the connection relation between the components that precede and follow the chain effect propagating component generates a chain delay effect. In the case where the chain delay effect is generated in the connection relation, the delay time of the component that follows the chain effect propagating component is determined by considering the chain delay effect. As a result, an error which was included in a calculation result by not considering the chain delay effect, is eliminated from the calculation result.

According to the present invention, a circuit analysis device for acquiring a signal delay time at a Register Transfer level of a circuit including multiple components, comprises a storage unit for storing: connection information including information about kinds and numbers of the multiple components and connection relations among components; delay information including information about a delay time of a discrete component and a chain delay time which is a delay time in a case in which a chain delay effect is generated by a connection with another component about each kind of the multiple components; and chain effect propagating component information including information about kinds of chain effect propagating components which are components for passing the chain delay effect, and a data processing unit for: when inputting information about behavioral description of the circuit, the delay information about each kind of the multiple components and the chain effect propagating component information, storing these kinds of information in the storage unit; performing a synthesis process of generating the connection information from the information about behavioral description and storing the connection information in the storage unit; referring to information stored in the storage unit; performing a total delay time calculation process of sequentially adding delay times of components along a signal path in the circuit; and if the chain effect propagating component is halfway through a signal path in the total delay time calculation process, examining a connection relation between components that precede and follow the chain effect propagating component and determining the delay time of the component that follows the chain effect propagating component that corresponds to the connection relations.

According to the circuit analysis device of the present invention, a delay analysis is performed from a behavioral description of a circuit. If the chain effect propagating component is halfway through the path when calculating the total delay time, it is determined whether or not the connection relation between the components that precede and follow the chain effect propagating component generates the chain delay effect. In the case where the chain delay effect is generated in the connection relation, the delay time of the component that follows the chain effect propagating component is determined by considering the chain delay effect.

Therefore, it is possible, even at a level such as the RT level which is more abstract than the gate level, to efficiently analyze a more accurate circuit propagation delay time for the circuit including the chain delay effect and more accurately estimate performance of the circuit.

The above and other objects, features and advantages of the present invention will become apparent from the following description with reference to the accompanying drawings which illustrate examples of the present invention.

DETAILED DESCRIPTION OF THE PREFERRED EMBODIMENT

A circuit analysis device of the present invention is characterized in that, even when provided between components in a connection relation generating a chain delay effect, information about a kind of component causing the chain delay effect is registered in a storage unit in advance, in addition to connection information and delay information about a circuit, to calculate a delay time of a path with reference to the registered information.

First Embodiment

Figure 1:
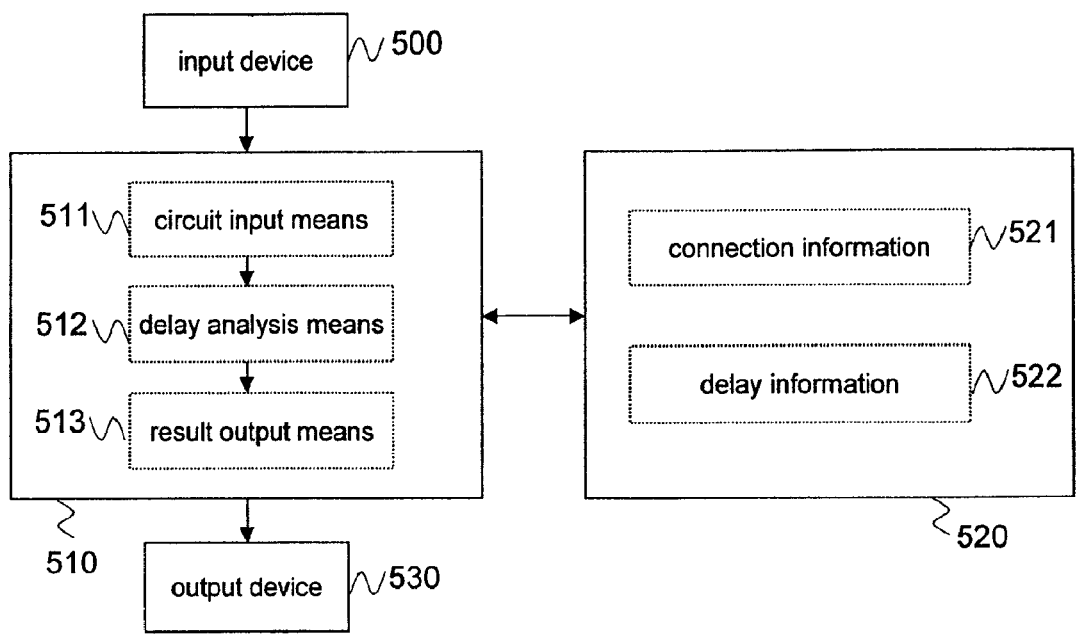
FIG. 1 is a block diagram showing a configuration example of a related circuit design system.
Figure 2:
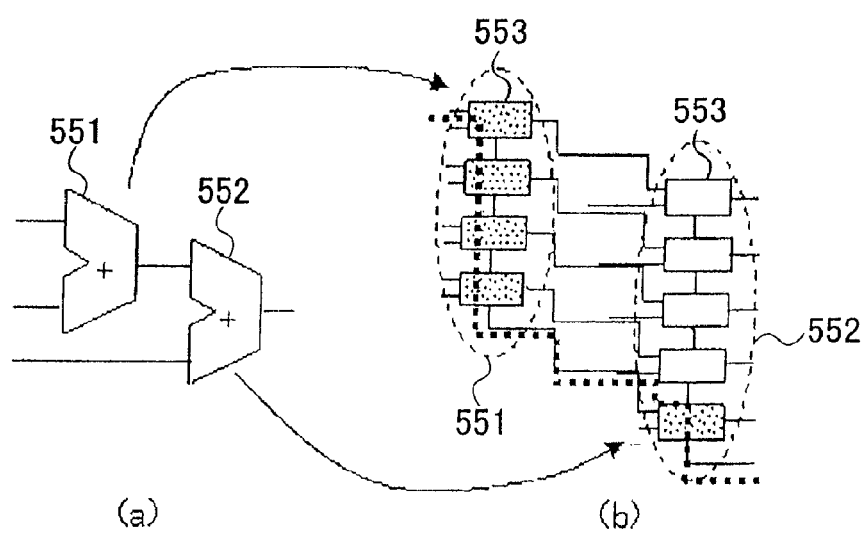
FIG. 2 is a diagram showing a circuit example of a chain connection of carry-propagate adders.
Figure 3:
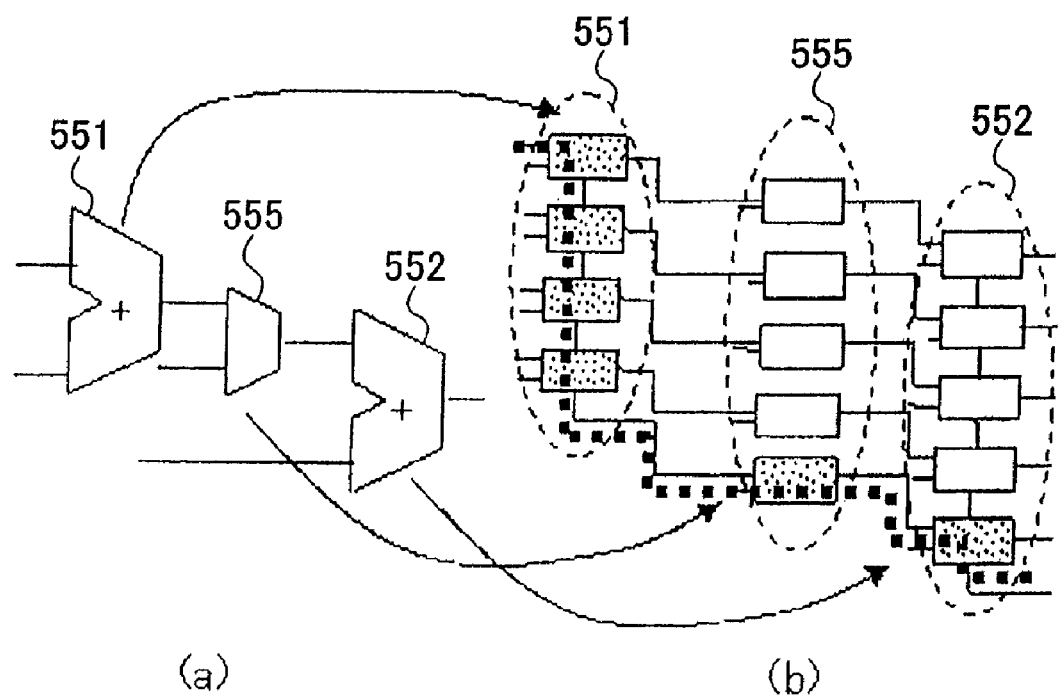
FIG. 3 is a diagram showing an example of connecting another component between the serially connected adders in two stages described in FIG. 2.
Figure 4:
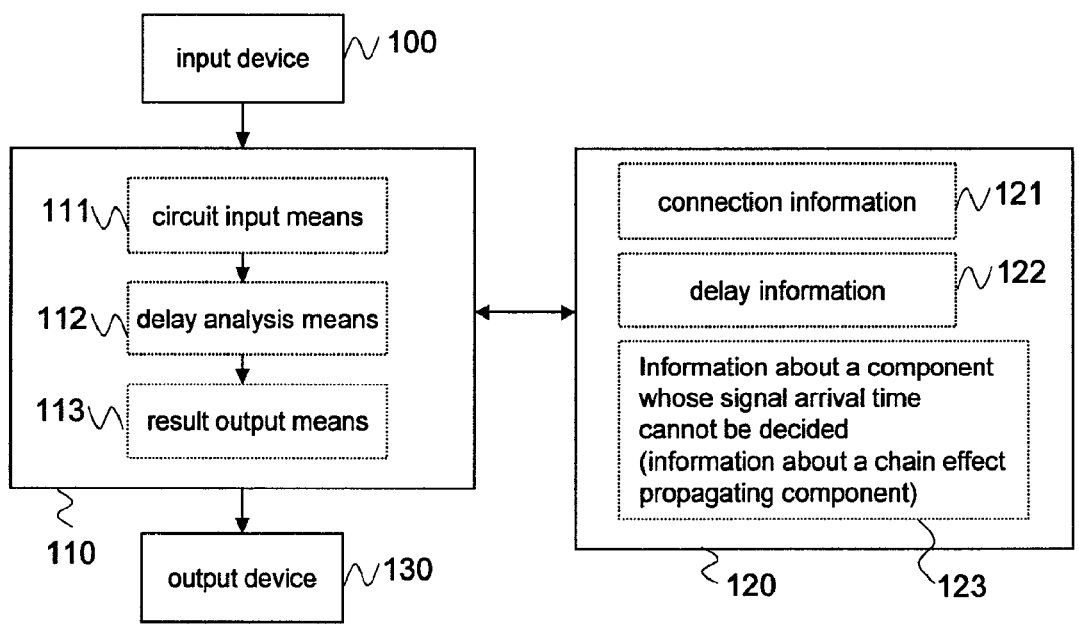
FIG. 4 is a block diagram showing a configuration example of a circuit design system according to a First embodiment.

Configuration of a circuit design system of this embodiment will be described in detail with reference to the drawings. FIG. 4 is a block diagram showing a configuration example of the circuit design system according to this embodiment.

As shown in FIG. 4, the circuit design system of this embodiment is configured to include input device 100 such as a keyboard and a magnetic disk reader, data-processing device 110 operated by program control, storage device 120 for storing information inputted from input device 100 and output device 130 such as a display unit. Data-processing device 110 includes circuit input means 111, delay analysis means 112 and result output means 113.

Data-processing device 110 includes a CPU (Central Processing Unit) (not shown) for performing a predetermined process according to a program and a memory (not shown) for storing the program. As the CPU executes the program, circuit input means 111, delay analysis means 112 and result output means 113 are virtually configured in data-processing device 110. Operations of these means will be briefly described.

If connection information 121 of the circuit, delay information 122 about each component in the circuit and information 123 about a component whose signal arrival time cannot be decided are inputted via input device 100, circuit input means 111 stores those pieces of information in storage device 120. Connection information 121 includes the kinds and numbers of the components that comprise the circuit and information about connection relations among the components. Since there are various kinds of description formats of connection information 121, circuit input means 111 processes the inputted connection information 121 into a format which is processable by delay analysis means 112. As for the components which generate the chain delay effect when connected with other components, delay information 122 includes information about the chain delay thereof, other than delays of discrete components.

Here, a description will be given as to the property of the component whose signal arrival time cannot be decided. In the case where no chain delay effect is generated between the components that precede and follow the component whose signal arrival time cannot be decided, hereinafter called "undecided A T component", a delay time of the component that follows the undecided A T component is the delay time of the discrete component. In the case where the chain delay effect is generated between the components that precede and follow the undecided A T component, the delay time of the component that follows the undecided A T component is replaced by a chain delay time. Thus, the component whose signal arrival time cannot be decided has the property of transmitting the chain delay effect, and so this component is called a chain effect propagating component (or "C E P component") hereunder. For instance, the property of the C E P component appears in a component for inputting and outputting signals via a bus. The multiplexer described in the description of the related art is one kind of C E P component. Information 123 about a component whose signal arrival time cannot be decided is the information that indicates the kind of C E P component.

If an instruction to acquire the signal arrival time at the end of the circuit is inputted, delay analysis means 112 acquires the signal arrival time by adding the delay times of the discrete components in sequence while referring to connection information 121 of the circuit, delay information 122 about each component and information 123 about C E P component as to the path from the origin to the end of the circuit. In that case, if the C E P component is halfway through the path from the origin to the end, the connection relations between the components that precede and follow the C E P component are examined. In the case where the connection relations do not generate the chain delay effect, the delay time of the discrete component that follows thereto is a subject of addition to the total delay time. In the case where the connection relations generate the chain delay effect, the delay time of the component that follows the C E P component is replaced by the chain delay time.

Result output means 113 determines the latest arrival time from the signal arrival times acquired as regards each of the paths. Result output means 113 makes output device 130 output the determined signal arrival time to show the result a user.

Figure 5:
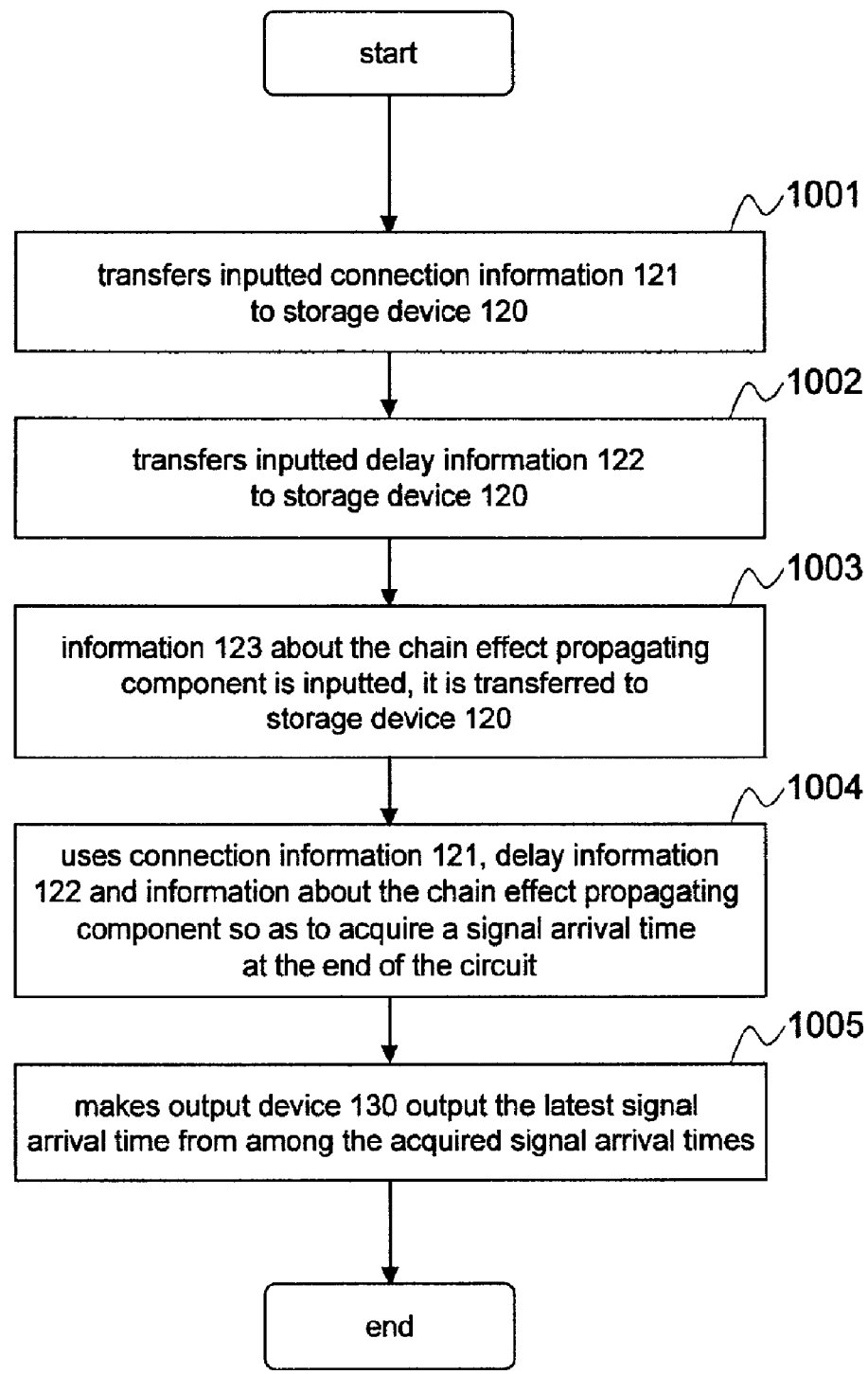
FIG. 5 is a flowchart showing the entire operation of the circuit design system according to the First embodiment.

Next, a description will be given as to the entire operation of the circuit design system of this embodiment. FIG. 5 is a flowchart showing an operation procedure of the circuit design system of this embodiment. Here, there are multiple components at the origins in the circuit, and there are multiple paths at the ends.

Connection information 121 which indicates the connection relations among the components of the circuits to be measurement subjects of the delay time is inputted to data-processing device 110 via input device 100 by the user. The description formats of connection information 121 include a description in language formats using hardware description languages such as Verilog-HDL and VHDL, a description in a graphic format and a description in a binary format. Any of the formats may be used. Circuit input means 111 converts connection information 121 in one format of the description to a format processable by data-processing device 110, and transfers it to storage device 120 (step 1001). Next, delay information 122 about each component in the circuit and information 123 about the C E P component are inputted via input device 100. Circuit input means 111 converts delay information 122 and information 123 about the C E P component to a format processable by data-processing device 110, and transfers it to storage device 120 (steps 1002 and 1003).

Subsequently, if an instruction to acquire the signal arrival time at the end of the circuit is inputted, delay analysis means 112 uses connection information 121, delay information 122 about each component in the circuit and information 123 about the C E P component so as to acquire each signal arrival time at the end of the circuit by following each of the paths from multiple components as the origins of signals in the circuit and by adding the delay times in sequence (step 1004). If the C E P component is halfway through the path, however, the connection relation between the C E P component and the component that precedes the C E P component and the connection relation between the C E P component and the component that follows the C E P component are examined to determine the delay time of the component that follows the CEP component that corresponds to the connection relations. Delay analysis means 112 thus acquires the signal arrival time at the end of each path, and result output means 113 makes output device 130 output the latest signal arrival time from among the acquired signal arrival times (step 1005). In step 1005, it is possible to output the signal arrival times of all the circuit components or to output the path from the origin to the end where the signal arrives latest. The signal arrival time at the end of the path is equivalent to total delay time of the path.

Figure 6:
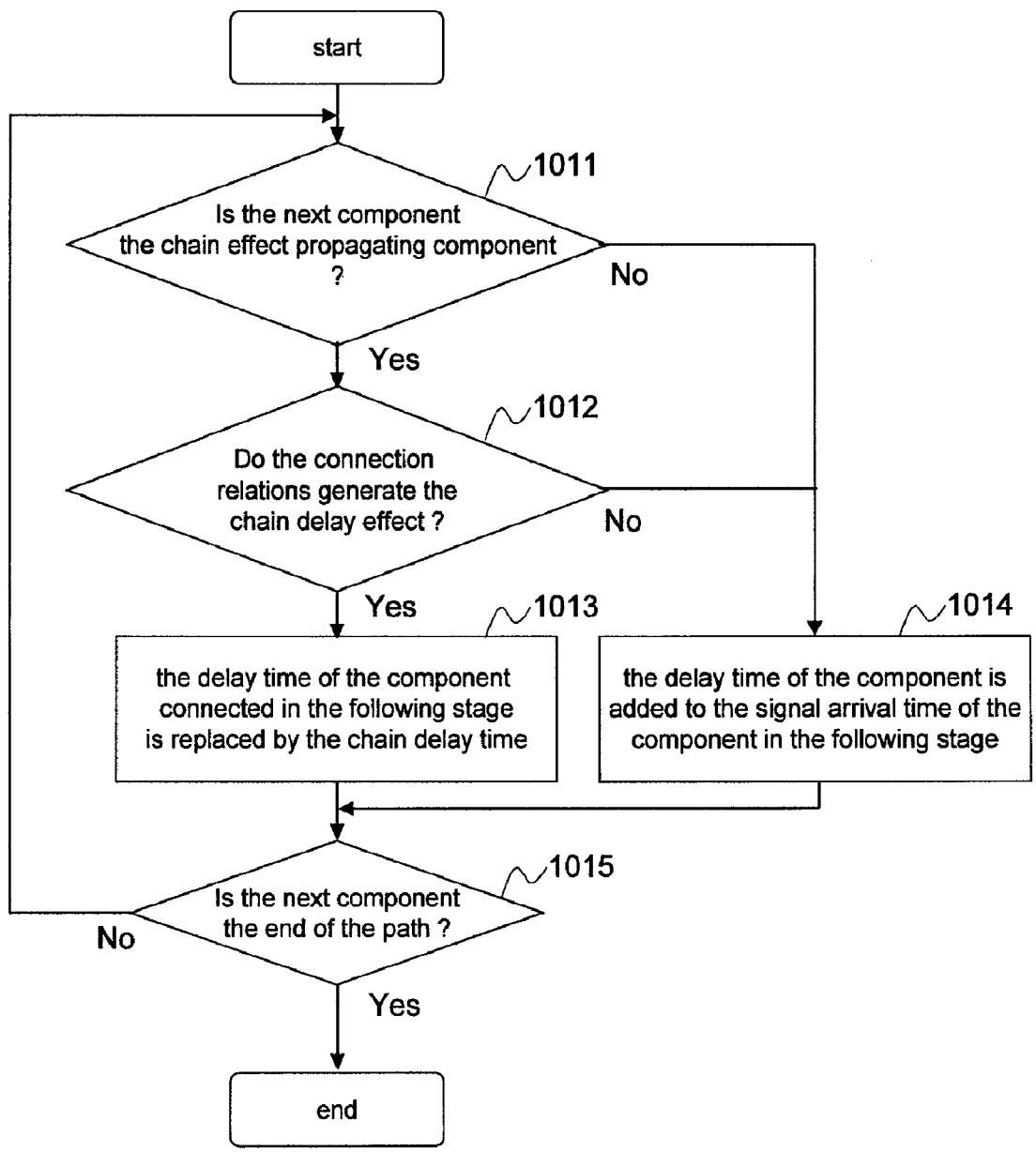
FIG. 6 is a flowchart showing a procedure of a delay analysis.

Next, the contents of delay analysis processing in step 1004 will be described in detail. FIG. 6 is a flowchart showing the procedure of the delay analysis.

It is determined whether or not the next component is the C E P component (step 1011). If it is the C E P component, it is determined whether or not the connection relation between the components that precede and follow the C E P component generates the chain delay effect (step 1012). In the case where the connection relation generate the chain delay effect, the delay time of the component that follows the C E P component is replaced by the chain delay time to add the chain delay time to the signal arrival time up to the C E P component (step 1013). In the case where the next component is not the C E P component in step 1011, the delay time of the next component is added to the signal arrival time of the component that precedes the next component. In the case where the connection relation between the components that precede and follow the C E P component does not generate the chain delay effect in step 1012, the delay time of the component that follows the C E P component is the delay time of the discrete component (step 1014). If the next component is not the end of the path, the step 1011 will be processed to the next component (step 1015).

Next, the effects of this embodiment will be described. According to this embodiment, information about the C E P component is stored in the storage device in advance as described above. For that reason, it is possible to predict the signal arrival time with high accuracy by taking the chain delay effect into consideration in the delay analysis of the circuit including the C E P component.

In the connection relations where the chain delay effect exists between the components having the signals inputted and outputted via the bus, the delay is influenced in a case in which another component is put between those components. According to the present invention, however, it is possible to efficiently measure a signal propagation delay of the circuit by taking the effect thereof into consideration.

Second Embodiment

Figure 7:
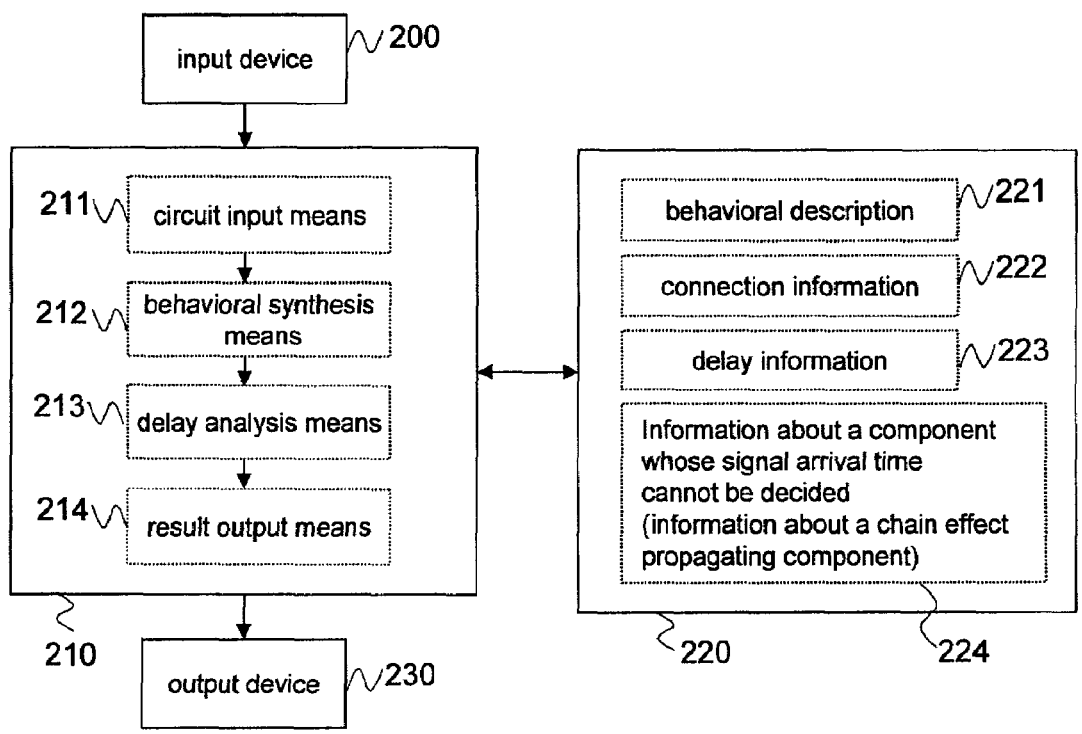
FIG. 7 is a block diagram showing a configuration example of the circuit design system according to a Second embodiment.

Configuration of a circuit design system of this embodiment will be described in detail with reference to the drawings. FIG. 7 is a block diagram showing a configuration example of the circuit design system according to this embodiment.

As shown in FIG. 7, the circuit design system of this embodiment is configured to include input device 200 such as a keyboard and a magnetic disk reader, data-processing device 210 operated by program control, storage device 220 for storing information inputted from input device 200 and output device 230 such as a display unit. Data-processing device 210 includes circuit input means 211, behavioral synthesis means 212, delay analysis means 213 and result output means 214.

Data-processing device 210 includes a CPU (not shown) for performing a predetermined process according to a program and a memory (not shown) for storing the program. As the CPU executes the program, circuit input means 211, behavioral synthesis means 212, delay analysis means 213 and result output means 214 are virtually configured in data-processing device 210. Operations of these means will be briefly described.

If information about behavioral description 221 of the circuit, delay information 223 about each component of the synthesized circuit and information 224 about the C E P component are inputted via the input device 200, circuit input means 211 stores those pieces of information in storage device 220.

Formats of behavioral description 221 of the circuit include a description in language formats using high-order languages such as C software language, C++ software language, SystemC software language and SpecC software language, and hardware description languages such as Verilog-HDL and VHDL, a description in a graphic format such as a state transition diagram and a description in a binary format.

Behavioral synthesis means 212 refers to the delay information 223 about circuit components and the like and generates connection information 222 about an RT level circuit from information about behavioral description 221 so as to store it in storage device 220.

Delay analysis means 213 has the same configuration as delay analysis means 112 of the First embodiment, and so a detailed description thereof will be omitted here. Result output means 214 has the same configuration as result output means 113 of the First embodiment, and so a detailed description thereof will be omitted here.

After data-processing device 210 acquires the signal arrival time at the end of each path, it compares the acquired signal arrival time with the performance specification of the circuit provided by a circuit designer to determine whether or not the performance specification is satisfied. In the case where the performance specification is not satisfied, data-processing device 210 executes behavioral synthesis processing again. In the case where the performance specification is satisfied, data-processing device 210 makes output device 230 output the synthesis result. Information about the performance specification is stored in storage device 220 in advance. The performance specification includes information about target values, such as total delay time of each of the paths and the largest value of the total delay time.

Figure 8:
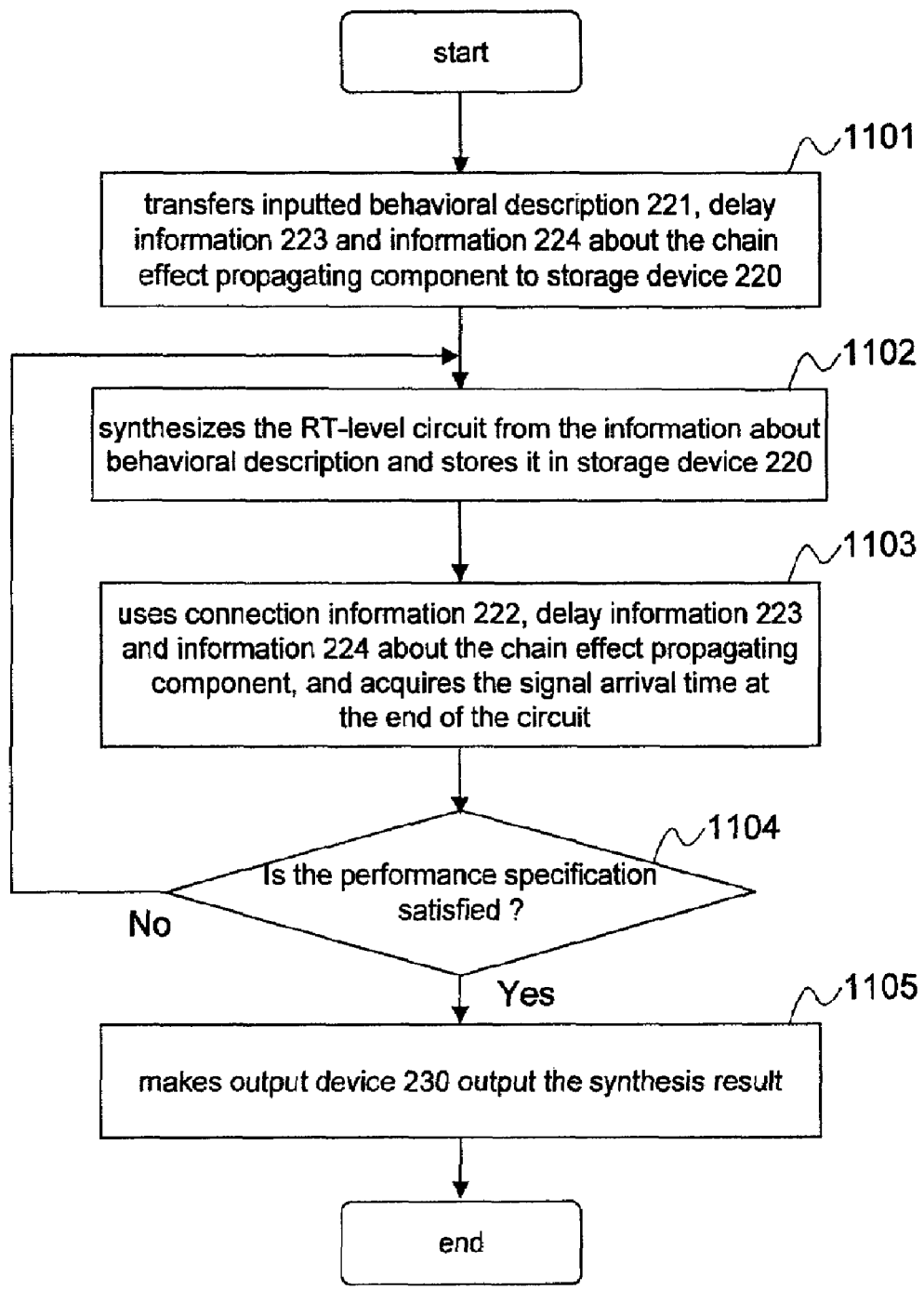
FIG. 8 is a flowchart showing the entire operation of the circuit design system according to the Second embodiment.

Next, a description will be given about the entire operation of the circuit design system of this embodiment. FIG. 8 is a flowchart showing the operation procedure of the circuit design system of this embodiment.

Information about behavioral description 221 of the circuit, delay information 223 about each component in the circuit and information 224 about the C E P component that are to be measurement subjects of the delay time are inputted via input device 200 by the user. Circuit input means 211 converts the information to a format processable by data-processing device 220, and transfers it to storage device 220 (step 1101).

Subsequently, behavioral synthesis means 212 utilizes delay information 223 about the components based on behavioral description 221 and the like and synthesizes the RT-level circuit from the information of behavioral description 221 so as to generate circuit connection information 222 and store it in storage device 220 (step 1102). And if an instruction to acquire the signal arrival time at the end of the circuit is inputted, delay analysis means 213 uses connection information 222, delay information 223 about each component and information 224 about the C E P component so as to acquire each signal arrival time at the end of the circuit by following each of the paths from multiple components as the origins of signals in the circuit and by adding the delay times in sequence (step 1103). If the C EP component is halfway through the path, however, delay analysis means 213 examines the connection relation between the C E P component and the component that precedes the C E P component and the connection relation between the C E P component and the component that follows the C E P component to determine the delay time of the component that follows the CEP component that corresponds to the connection relations. Delay analysis means 213 thus acquires the signal arrival time at the end of each path.

As a result of the processing step 1103, delay analysis means 213 compares the acquired signal arrival time with the performance specification of the circuit provided by the circuit designer to determine whether or not the performance specification is satisfied (step 1104). In the case where the performance specification is not satisfied, behavioral synthesis means 212 executes behavioral synthesis processing again by returning to step 1102. In the case where the performance specification is satisfied in step 1104, result output means 214 makes output device 230 output the synthesis result (step 1105).

Next, advantages of this embodiment will be described. As described above, according to this embodiment, it is possible to predict the delay time with high accuracy by storing information about the C E P component in the storage device in advance and by considering the chain delay effect against the performance of the circuit obtained using behavioral synthesis. As no time-consuming process is required, such as exhaustively verifying all the paths, it is possible to repeatedly execute the process between step 1102 and step 1104 shown in FIG. 8 many times so that the behavioral synthesis means for synthesizing a circuit of higher quality can be realized.

Example 1

In this example, the method of delay analysis described in the First and Second embodiments will be described in detail. In this example, the delay time of component n is described as delay (n), the delay time of component n in the chain of components m to n is described as delay (m, n), and the time when the latest signal arrives at an output terminal of component n is described as atime (n).

Figure 9:
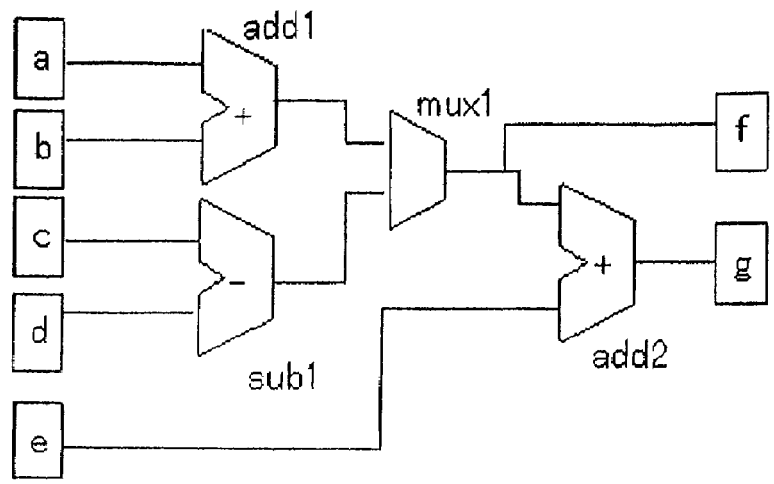
FIG. 9 is an example showing connection information about a circuit according to Example 1.
Figure 10:
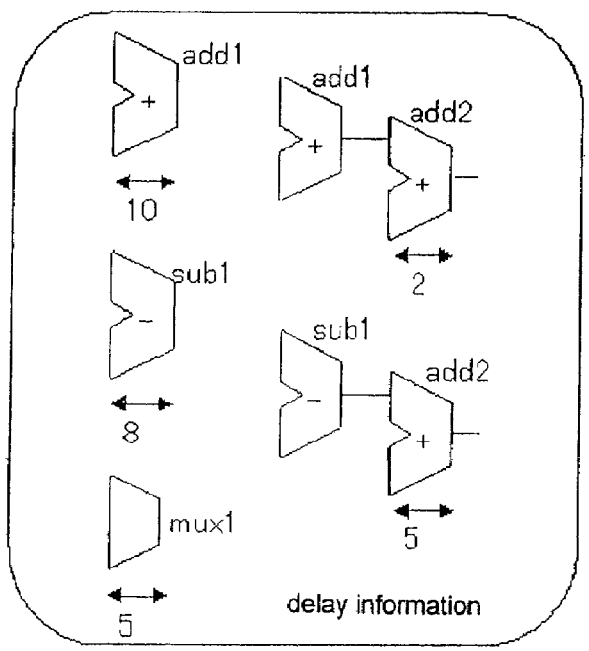
FIG. 10 is a diagram showing delay information about the circuit shown in FIG. 9.

FIG. 9 is an example showing connection information about the circuit. As shown in FIG. 9, the circuit is composed of operational components add1, add2, sub1 and mux1 and components of registers a, b, c, d, e, f and g. And there are connections of a→add1, b→add1, c→sub1, d→sub1, add1→mux1, sub1→mux1, mux1→f, mux1→add2, e→add2 and add2→g. The delay times of operational components add1, add2, sub1 and mux1 are 10, 10, 8 and 5 respectively. The delay time of add2 in the chain of add1→add2 is 2, and the delay time of add2 in the chain of sub1→add2 is 5. The delay information putting these delay times together is shown in FIG. 10. As the delay time of add2 alone is equal to add1, a description thereof is omitted in FIG. 10. The values of these delay times indicate relative values to a reference delay time, and so the units thereof are omitted.

Figure 11:
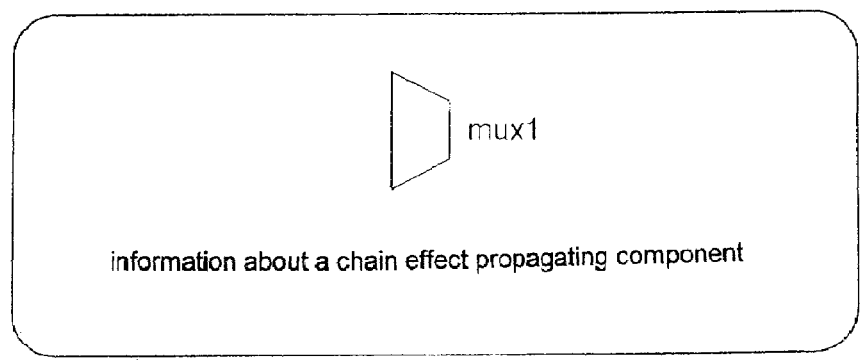
FIG. 11 is information about a component of Example 1 in which the signal arrival time cannot be decided.

In this example, mux1 is the C E P component wherein the signal arrival time cannot be decided because the chain delay effect passes through. FIG. 11 is an example showing information about the C E P component, and this information is stored in the storage device.

A maximum delay time between the registers that determines a maximum operating frequency of this circuit is acquired by the following procedure, for instance.

First, as with the technique described in Document 1, the components that are to be at the origins and at the ends of the paths are determined, and then all the components are sorted so that they are sequential from the origin to the end. They are classified into the components that are to be at the origins of the paths, components existing halfway through the paths and the components that are to be at the ends of the paths, and the result is saved in a list. This list is called a sort list. The components that are to be at the origins are the register and the external input terminal, for instance. The components that are to be at the ends are the register and the external output terminal, for instance. Here, according to the present invention, the C E P component is excluded from the subjects of the sort list by referring to the information about the C E P component. In the case of the example shown in FIG. 9, the list obtained as a result of the sort is a, b, c, d, e, add1, sub1, f, add2, and g.

Next, the latest arrival time of the signal at each component is determined as follows according to the sequence in the sort list. The latest arrival time of the signal is called the latest signal arrival time.

It is possible, by calculating the delay times in a presorted order, to efficiently acquire the latest signal arrival times of all the components that are closer to the origin than an arbitrary component on the path because the delay time of each component is decided in FIG. 10. However, regarding a component through which the chain delay effect is transmitted, such as the C E P component, there is the possibility that the component that precedes the C E P component may be chained with the component that follows the C E P component. For that reason, about the component that precedes the C E P component, the latest signal arrival time cannot be determined just from that component that precedes the C E P component. As the latest signal arrival time cannot be decided about the component that precedes the C E P component, the C E P component is excluded from the subjects of the above-mentioned source list.

A description will be given as to how to acquire the latest signal arrival time of each component of the circuit shown in FIG. 9. FIGS. 12 to 15 are diagrams for describing the procedure for acquiring the latest signal arrival time.

Figure 12:
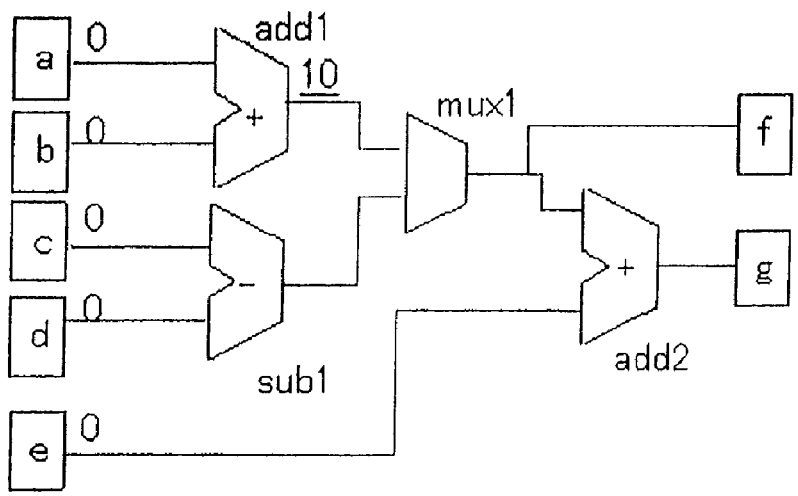
FIG. 12 is a diagram for describing a procedure for acquiring the signal arrival time of a component "add1" of Example 1.

In the example shown in FIG. 9, the signal arrival time of registers a, b, c, d and e is set at 0, and then the delay at the output terminal of add1 is determined according to the source list. In this case, no chain delay effect exists because the input terminals of add1 are directly connected to origins a and b respectively. Therefore, the latest signal arrival time at the output terminal of add1 is: atime (add1)=max (atime (a)+delay (add1), atime (b)+delay (add1))=max (0+10, 0+10)=10 (FIG. 12).

Figure 13:
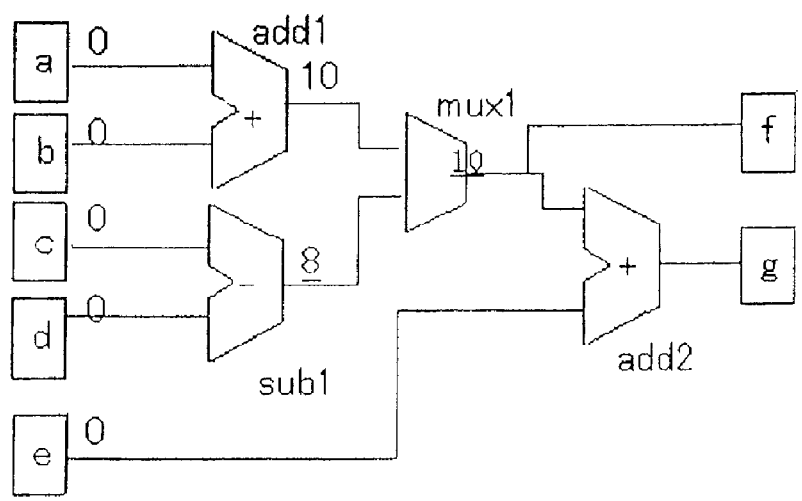
FIG. 13 is a diagram for describing the procedure for acquiring the signal arrival time of component "sub1" of the Example 1.
Figure 14:
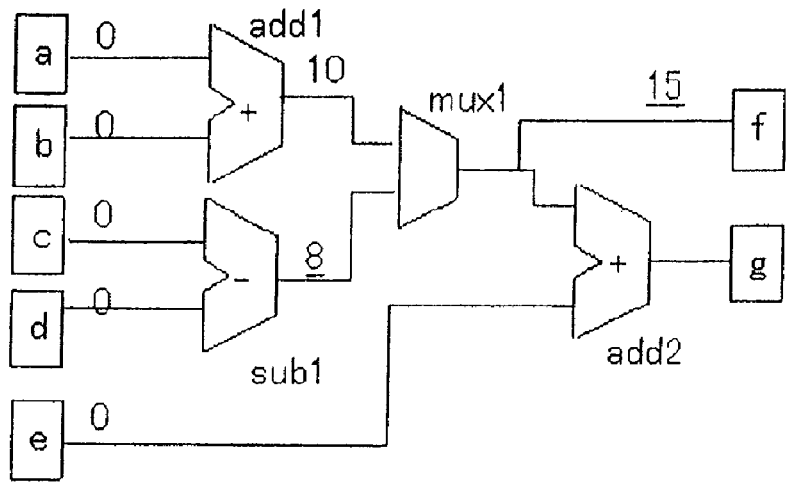
FIG. 14 is a diagram for describing the procedure for acquiring the signal arrival time of component "mux1" of Example 1.

To acquire the latest signal arrival time of sub1 likewise, the latest signal arrival time of sub1 is: atime (sub1)=max (atime (c)+delay (sub1), atime (d)+delay (sub1))=max (0+8, 0+8)=8 (FIG. 13). As shown in FIG. 13, it is evident that the arrival time of a signal arriving at mux1 by way of operational component add1 is later than the arrival time of a signal arriving at mux1 by way of operational component sub1. To acquire the latest signal arrival time of f likewise, the latest signal arrival time of "f" is: atime (f=max (atime (add1)+delay (mux1), atime (sub1)+delay (mux1))=max (10+5, 8+5)=15 (FIG. 14).

Figure 15:
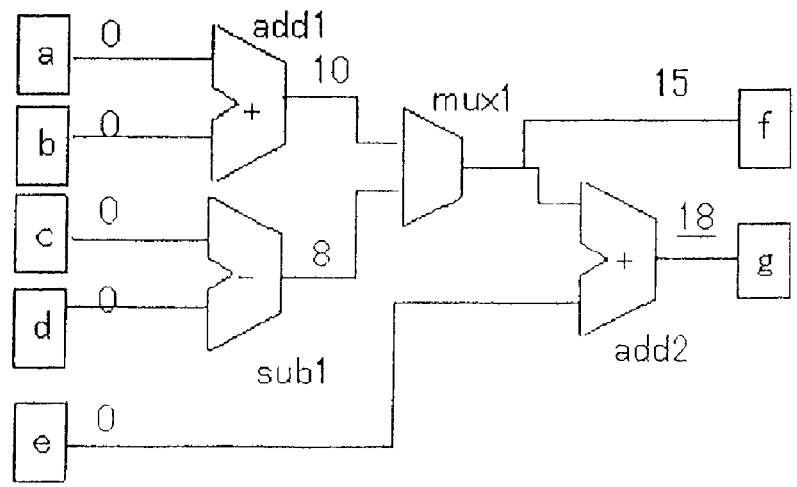
FIG. 15 is a diagram for describing the procedure for acquiring the signal arrival time of component "add2" of Example 1.

Next, the latest signal arrival time of add2 is determined as follows. Here, with reference to the circuit shown in FIG. 9, mux1 which is the C E P component is connected to one of the input terminals of add2. For that reason, the latest signal arrival time of mux1 is not decided. Therefore, it is necessary to follow the input terminals of mux1 and to examine the connection relation between add1 connected to the input side of mux1 and add2, and the connection relation between sub1 connected to the input side of mux1 and add2. With reference to the delay information shown in FIG. 10, the chain delay effect exists in the connection between add1 and add2 and in the connection between sub1 and add2 respectively. For that reason, the delay time of add2 is a chain delay time 2 regarding the connection with add1, and the delay time of add2 is a chain delay time 5 regarding the connection with sub1. Therefore, the latest signal arrival time of add2 is: atime (add2)=max {atime (add1)+delay (mux1)+delay (add2, add1), atime (sub1)+delay (mux1)+delay (add2, sub1), atime (e)+delay (add2)}=max (10+5+2, 8+5+5, 0+10)=18 (FIG. 15). Lastly, the signal arrival time of end g is acquired as atime (g)=atime (add2)=18. Thus, the maximum delay time of the circuit shown in FIG. 9 is determined to be 18 from the result shown in FIG. 5.

Figure 16A:
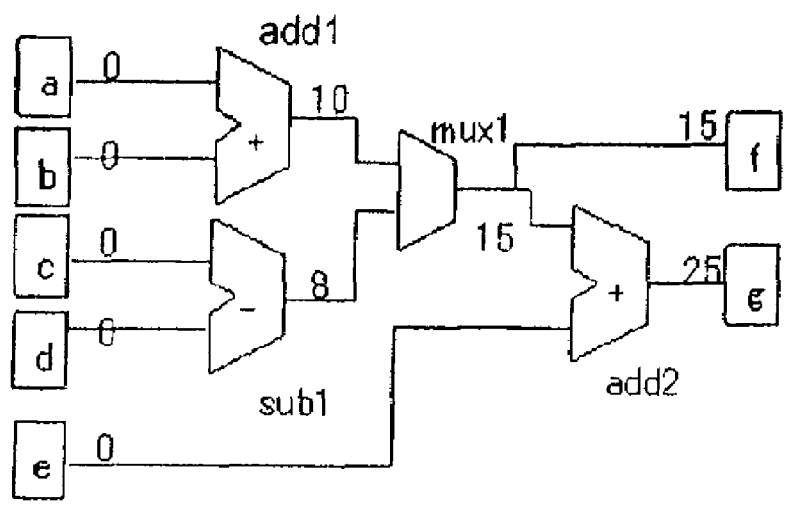
FIGS. 16A and 16B are diagrams for describing the case where a delay time is calculated by a conventional method.
Figure 16B:
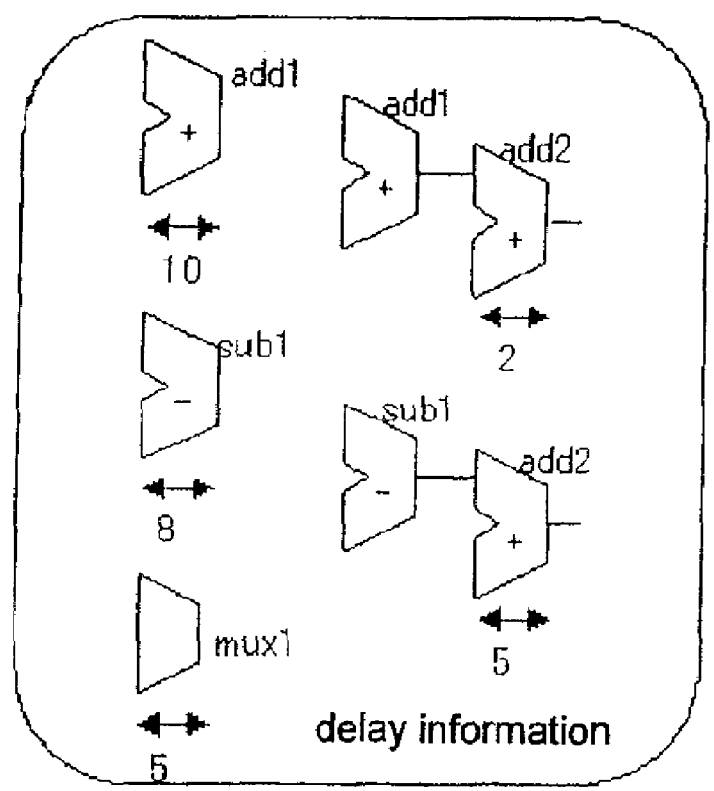

FIGS. 16A and 16B are diagrams showing a delay result according to a conventional method. According to the conventional method, the latest signal arrival time of end g is calculated by utilizing the delay information shown in FIG. 16B as atime (g)=atime (add2)=max {atime (add1)+delay (mux1)+delay (add2), atime (sub1)+delay (mux1)+delay (add2), atime (e)+delay (add2)}=max (10+5+10, 8+5+10, 0+10)=25 (FIG. 16A). This includes an error of delay time 7 compared to the result of this embodiment.

As above, it is possible to acquire a more accurate delay of an operational component in view of the chain delay by having each component store the information about the C E P component in the storage device and refer to it when measuring the delay.

Example 2

This example is the case in which there are multiple paths in the C E P component, and whether or not to propagate the chain delay effect depending on each individual path.

In this example, the delay of component n is described as delay (n), the delay of component n in a chain of components m to n is described as delay (m, n), and the time when the latest signal arrives at the output terminal of component n is described as atime (n).

Figure 17:
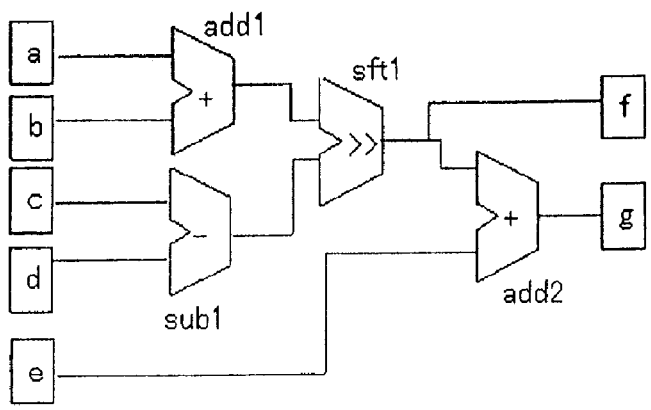
FIG. 17 is an example showing connection information of the circuit according to example 2.
Figure 18:
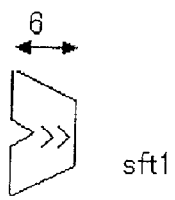
FIG. 18 is a diagram showing the delay information about a component added in example 2.

FIG. 17 is an example showing connection information about the circuit. As shown in FIG. 17, the circuit is composed of operational components add1, sub1, sft1 and add2 and components of registers a, b, c, d, e, f and g. And there are connections of a→add1, b→add1, add1→sft1, sft1→f, sft1→add2, c→sub1, d→sub1, e→add2 and add2→g. As in the Example 1, the delays of operational components add1, add2 and sub1 are 10, 10 and 8 respectively. As in the Example 1, the chain delays of add2 in the chains of add1→add2 and sub1→add2 are 2 and 5 respectively. The delay of operational component sft1 is 6 as shown in FIG. 18.

Figure 19:
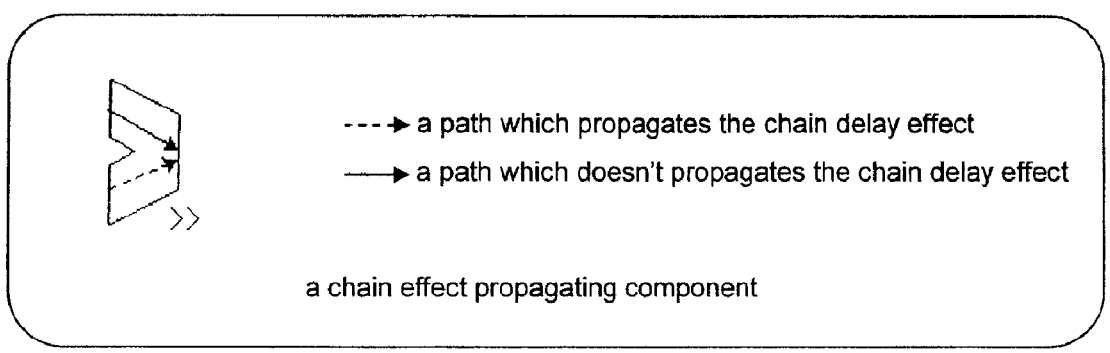
FIG. 19 is a diagram showing an example of information about a chain effect propagating component of this example.

In this example, sft1 is the C E P component wherein the signal arrival time cannot be decided because the chain delay effect passes through sft1. FIG. 19 is a diagram showing an example of information about the C E P component of this example that is to be stored in the storage device. Here, the property of operational component sft1 will be described. Operational component sft1 includes two input terminals. And operational component sft1 has a property of propagating the chain delay effect on the path leading from one of the two input terminals to the output terminal but propagating no chain delay effect on the path leading from the other input terminal to the output terminal. As with operational component sft1, there are the cases in which multiple paths exist in the C E P component, and whether or not the path has a function of propagating the chain delay effect varies according to each individual path. In such cases, information about whether or not each path has the function of propagating the chain delay effect is included in the information about the C E P component and is stored in the storage device as shown in FIG. 19.

The maximum delay between the registers that determines a maximum operating frequency of the circuit shown in FIG. 17 is acquired by the following procedure, for instance.

First, as in Example 1, the sort list is created for components at which the signal arrival time can be decided. In the case of the example shown in FIG. 17, the list obtained as a result of the sort is a, b, c, d, e, add1, sub1, f, add2, and g.

Figure 20:
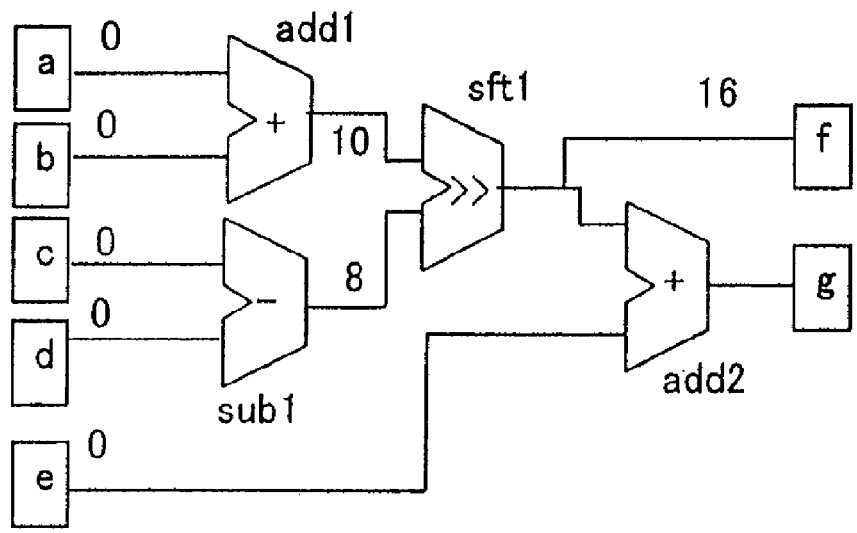
FIG. 20 is a diagram showing the signal arrival times of the circuit and each of the components when the signal arrival time of component "f" is acquired according to example 2.

Next, the arrival time of registers a, b, c, d and e is set at 0 according to the sort list. To acquire the signal arrival times of add1 and sub1 as in Example 1, the signal arrival time at the output terminal of add1 is: atime (add1)=max {atime (a)+delay (add1), atime (b)+delay (add1)}=10. The signal arrival time of sub1 is: atime (sub1)=max {atime (c)+delay (sub1), atime (d)+delay (sub1)}=8. And the signal arrival time of f is: atime (f=max {atime (add1)+delay (sft1), atime (add2)+delay (sft1)}=16. FIG. 20 is a diagram showing the signal arrival time of each of the components of the circuit when the signal arrival time of "f" is acquired.

Next, the signal arrival time of add2 is determined as follows. Here, referring to the circuit shown in FIG. 17, sft1 which is the C E P component, is connected to one of the input terminals of add2. It becomes evident by referring to the information about the C E P component shown in FIG. 19 that the one of two input terminals of sft1, which is connected to sub1, propagates the chain delay effect. For that reason, it is necessary to examine the connection relation between sub1 and add2. The chain delay effect exists in the connection between sub1 and add2 as indicated in the delay information shown in FIG. 10. For that reason, the delay time of add2 becomes a chain delay 5 in the connection with sub1.

Figure 21:
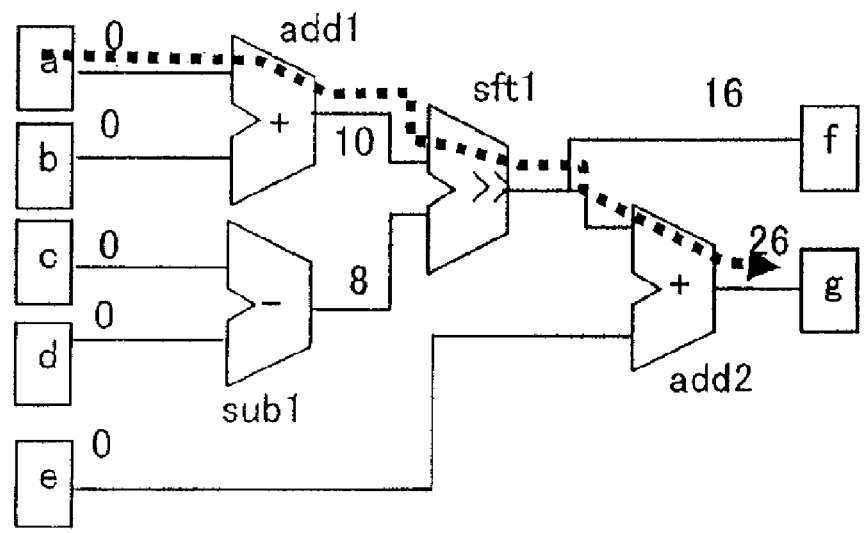
FIG. 21 is a diagram showing a result of seeking a maximum delay time of the circuit shown in FIG. 17.

It becomes evident by referring to FIG. 19 that the terminal connected to add1 of component sft1 does not propagate the chain delay. Therefore, no chain delay effect exists in the connection between add1 and add2. For that reason, the delay time of add2 becomes 10 in the connection with add1 as in the case of the delay of the discrete component. Therefore, the signal arrival time of add2 is: atime (add2)=max {atime (add1)+delay (sft1)+delay (add2), atime (sub1)+delay (sft1)+delay (sub1, add2), atime (e)+delay (add2)}=max(10+6+10, 8+6+5, 0+10)=26. Thus, as shown in FIG. 21, the maximum delay time of the circuit shown in FIG. 17 is determined to be 26.

According to this example, even in the case of a circuit that includes a component wherein whether or not to propagate the chain delay effect varies according to each individual path, it is possible, as described above, to acquire the delay of the circuit with high accuracy by including information about whether or not each individual path of the C E P component propagates the chain delay effect in the information about the component.

According to the present invention, when measuring the delay time of a place where the signal arrival time cannot be decided due to the chain delay effect on the path, the delay analysis which takes into consideration the chain delay effect is performed by referring to the information about the component for propagating the chain delay effect. For that reason, it is possible to efficiently analyze a more accurate circuit propagation delay for the circuit having the chain delay effect. As a result, it is possible to more accurately estimate the performance of the circuit represented at a level such as the RT level which is more abstract than the gate level.

The present invention is applicable to a circuit analysis device for estimating performance of a circuit and a program for causing a computer to execute a circuit analysis method. It is also applicable to a behavioral synthesis device for automatically synthesizing an RT-level description from a behavioral description and a program for causing a computer to execute the behavioral synthesis device. The circuit analysis device and the behavioral synthesis device are provided with a data processing unit equivalent to data-processing devices 110 and 210, a storage unit equivalent to storage devices 120 and 220 and the like.

The circuit analysis method of the present invention is also applicable to the program for causing a computer to execute it, and the program may be recorded on a recording medium readable by the computer.

While preferred embodiments of the present invention have been described using specific terms, such description is for illustrative purposes only, and it is to be understood that changes and variations may be made without departing from the spirit or scope of the following claims.

What is claimed is:

1. A circuit analysis device for acquiring a signal delay time at a Register Transfer level of a circuit including multiple components, comprising:

a storage unit for storing:

connection information including information about kinds and numbers of said multiple components and connection relations among components;

delay information including information about a delay time of a discrete component and a chain delay time which is a delay time in a case in which a chain delay effect is generated by a connection with another component about each kind of said multiple components; and chain effect propagating component information including information about kinds of chain effect propagating components which are components for transmitting the chain delay effect, and a data processing unit for:

when inputting said connection information, said delay information about each kind of said multiple components and said chain effect propagating component information, storing these kinds of information in said storage unit;

referring to information stored in said storage unit;

performing a total delay time calculation process of sequentially adding delay times of components along a signal path in said circuit; and determining that a chain effect propagating component is halfway through a signal path in a total delay time calculation process, examining a connection relation between components that precede and follow said chain effect propagating component and determining a delay time of the component that follows said chain effect propagating component that corresponds to the connection relations.

2. The circuit analysis device according to claim 1, wherein:

determining that a chain effect propagating component is connected halfway through said signal path in said total delay time calculation process, said data processing unit determines whether or not a connection between components that precede and follow said chain effect propagating component is in a connection relation for generating the chain delay effect so as to replace the delay time of the component that follows said chain effect propagating component by the chain delay time in a case of being in the connection relation, and to replace the delay time of the component that follows said chain effect propagating component by the delay time of the discrete component in a case of not being in the connection relation.

3. The circuit analysis device according to claim 1, wherein said chain effect propagating component is a component for inputting and outputting signals via a bus.

4. The circuit analysis device according to claim 1, wherein:

said chain effect propagating component includes multiple paths leading from an input to an output and has a property to propagate or not to propagate the chain delay effect for each of said multiple paths; and said chain effect propagating component information includes information about whether or not to propagate the chain delay effect for each of said multiple paths of said chain effect propagating component.

5. A circuit analysis device for acquiring a signal delay time at a Register Transfer level of a circuit including multiple components, comprising:

a storage unit for storing:

connection information including information about kinds and numbers of said multiple components and connection relations among components;

delay information including information about a delay time of a discrete component and a chain delay time which is a delay time in a case in which a chain delay effect is generated by a connection with another component about each kind of said multiple components; and chain effect propagating component information including information about kinds of chain effect propagating components which are components for passing the chain delay effect, and a data processing unit for:

when inputting information about behavioral description of said circuit, said delay information about each kind of said multiple components and said chain effect propagating component information, storing these kinds of information in said storage unit;

performing a synthesis process of generating said connection information from said information about behavioral description and storing said connection information in said storage unit;

referring to information stored in said storage unit;

performing a total delay time calculation process of sequentially adding delay times of components along a signal path in said circuit; and determining that a chain effect propagating component is halfway through a signal path in said total delay time calculation process, examining a connection relation between components that precede and follow said chain effect propagating component and determining the delay time of the component that follows said chain effect propagating component that corresponds to the connection relations.

6. The circuit analysis device according to claim 5, wherein:

information about a performance specification of said circuit is stored in said storage unit; and said data processing unit compares a result of said total delay time calculation process with said performance specification, performs said synthesis process and said total delay time calculation process again in a case in which said performance specification is not satisfied, and makes an output unit output a result of said synthesis process in a case in which the performance specification is satisfied.

7. The circuit analysis device according to claim 5, wherein:

determining that a chain effect propagating component is connected halfway through said signal path in said total delay time calculation process, said data processing unit determines whether or not a connection between components that precede and follow said chain effect propagating component is in a connection relation for generating the chain delay effect so as to replace the delay time of the component that follows said chain effect propagating component by the chain delay time in a case of being in the connection relation, and to replace the delay time of the component that follows said chain effect propagating component by the delay time of the discrete component in a case of not being in the connection relation.

8. The circuit analysis device according to claim 5, wherein said chain effect propagating component is a component for inputting and outputting signals via a bus.

9. The circuit analysis device according to claim 5, wherein:

said chain effect propagating component includes multiple paths leading from an input to an output and has a property to propagate or not to propagate the chain delay effect for each of said multiple paths; and said chain effect propagating component information includes information about whether or not to propagate the chain delay effect for each of said multiple paths of said chain effect propagating component.

10. A circuit analysis method by a circuit analysis device for acquiring a signal delay time at a Register Transfer level of a circuit including multiple components, comprising the steps of:

storing as machine readable information in a machine storage unit, connection information including information about kinds and numbers of said multiple components and connection relations among components; delay information including information about a delay time of a discrete component and a chain delay time which is a delay time in a case in which a chain delay effect is generated by a connection with another component about each kind of said multiple components; and chain effect propagating component information including information about kinds of chain effect propagating components which are components for transmitting the chain delay effect, and referring to information stored in said storage unit;

performing a total delay time calculation process of sequentially adding delay times of the components along a signal path in said circuit; and determining that a chain effect propagating component is halfway through a signal path in said total delay time calculation process, examining a connection relation between components that precede and follow said chain effect propagating component and determining a delay time of the component that follows said chain effect propagating component that corresponds to the connection relations.

11. The circuit analysis method according to claim 10, wherein:

determining that a chain effect propagating component is connected halfway through the signal path in said total delay time calculation process, it is determined whether or not a connection between components that precede and follow said chain effect propagating component is in a connection relation for generating the chain delay effect so as to replace the delay time of the component that follows said chain effect propagating component by the chain delay time in a case of being in the connection relation, and to replace the delay time of the component that follows said chain effect propagating component by the delay time of the discrete component in a case of not being in the connection relation.

12. The circuit analysis method according to claim 10, wherein said chain effect propagating component is a component for inputting and outputting signals via a bus.

13. The circuit analysis method according to claim 10, wherein:

said chain effect propagating component includes multiple paths leading from an input to an output and has a property to propagate or not to propagate the chain delay effect for each of said multiple paths; and said chain effect propagating component information includes information about whether or not to propagate the chain delay effect for each of said multiple paths of said chain effect propagating component.

14. A circuit analysis method by a circuit analysis device for acquiring a signal delay time at a Register Transfer level of a circuit including multiple components, comprising the steps of:

storing machine readable information in a machine storage unit, information about behavioral description of said circuit; delay information including information about a delay time of a discrete component and a chain delay time which is a delay time in a case in which a chain delay effect is generated by a connection with another component about each kind of said multiple components; and chain effect propagating component information including information about kinds of chain effect propagating components which are components for passing the chain delay effect, and performing a synthesis process of generating connection information including information about kinds and numbers of said multiple components and connection relations among the components from said information about behavioral description and storing said connection information in said storage unit;

referring to information stored in said storage unit;

performing a total delay time calculation process of sequentially adding delay times of components along a signal path in said circuit; and determining that a chain effect propagating component is halfway through a signal path in said total delay time calculation process, examining a connection relation between components that precede and follow said chain effect propagating component and determining the delay time of the component that follows said chain effect propagating component that corresponds to the connection relations.

15. The circuit analysis method according to claim 14, wherein:

information about a performance specification of said circuit is stored in said storage unit; and a result of said total delay time calculation process is compared with said performance specification so that said synthesis process and said total delay time calculation process are performed again in a case in which said performance specification is not satisfied, and a result of said synthesis process is outputted by an output unit in a case in which said performance specification is satisfied.

16. The circuit analysis method according to claim 14, wherein:

determining that a chain effect propagating component is connected halfway through the signal path in said total delay time calculation process, it is determined whether or not a connection between components that precede and follow said chain effect propagating component is in a connection relation for generating the chain delay effect so as to replace the delay time of the component that follows said chain effect propagating component by the chain delay time in a case of being in the connection relation, and to replace the delay time of the component that follows said chain effect propagating component by the delay time of the discrete component in a case of not being in the connection relation.

17. The circuit analysis method according to claim 14, wherein said chain effect propagating component is a component for inputting and outputting signals via a bus.

18. The circuit analysis method according to claim 14, wherein:

said chain effect propagating component includes multiple paths leading from an input to an output and has a property to propagate or not to propagate the chain delay effect for each of said multiple paths; and said chain effect propagating component information includes information about whether or not to propagate the chain delay effect for each of said multiple paths of said chain effect propagating component.

19. A recording medium including a computer-readable program recorded therein for acquiring a signal delay time at a Register Transfer level of a circuit including multiple components, the program causing the computer to execute a process comprising the steps of:

storing in a storage unit, connection information including information about kinds and numbers of said multiple components and connection relations among components; delay information including information about a delay time of a discrete component and a chain delay time which is a delay time in a case in which a chain delay effect is generated by a connection with another component about each kind of said multiple components; and chain effect propagating component information including information about kinds of chain effect propagating components which are components for transmitting the chain delay effect, and referring to information stored in said storage unit;

performing a total delay time calculation process of sequentially adding delay times of the components along a signal path in said circuit; and determining that a chain effect propagating component is halfway through a signal path in said total delay time calculation process, examining a connection relation between components that precede and follow said chain effect propagating component and determining a delay time of the component that follows said chain effect propagating component that corresponds to the connection relations.

20. The recording medium having a program recorded therein according to claim 19, the program causing the computer to further execute the steps of:

determining that a chain effect propagating component is connected halfway through the signal path in said total delay time calculation process, determining whether or not a connection between components that precede and follow said chain effect propagating component is in a connection relation for generating the chain delay effect; and replacing the delay time of the component that follows said chain effect propagating component by the chain delay time in a case in which the connection is in the connection relation for generating the chain delay effect, and replacing the delay time of the component that follows said chain effect propagating component by the delay time of the discrete component in a case in which the connection is not in the connection relation for generating the chain delay effect.

21. The recording medium including a program recorded therein according to claim 19, wherein said chain effect propagating component is a component for inputting and outputting signals via a bus.

22. The recording medium including a program recorded therein according to claim 19, wherein:

said chain effect propagating component includes multiple paths leading from an input to an output and has a property to propagate or not to propagate the chain delay effect for each of said multiple paths; and said chain effect propagating component information includes information about whether or not to propagate the chain delay effect for each of said multiple paths of said chain effect propagating component.

23. A recording medium including a computer-readable program recorded therein for acquiring a signal delay time at a Register Transfer level of a circuit including multiple components, the program causing the computer to execute a process comprising the steps of:

storing in a storage unit, information about behavioral description of said circuit; delay information including information about a delay time of a discrete component and a chain delay time which is a delay time in a case in which a chain delay effect is generated by a connection with another component about each kind of said multiple components; and chain effect propagating component information including information about kinds of chain effect propagating components which are components for passing the chain delay effect, and performing a synthesis process of generating connection information including information about kinds and numbers of said multiple components and connection relations among the components from said information about behavioral description and storing said connection information in said storage unit;

referring to information stored in said storage unit;

performing a total delay time calculation process of sequentially adding delay times of components along a signal path in said circuit; and determining that a chain effect propagating component is halfway through a signal path in said total delay time calculation process, examining a connection relation between components that precede and follow said chain effect propagating component and determining the delay time of the component that follows said chain effect propagating component that corresponds to the connection relations.

24. The recording medium including a program recorded therein according to claim 23, the program causing the computer to further execute the steps of:

storing information about a performance specification of said circuit in said storage unit; and comparing a result of said total delay time calculation process with said performance specification, performing said synthesis process and said total delay time calculation process again in a case in which said performance specification is not satisfied, and making an output unit output a result of said synthesis process in a case in which said performance specification is satisfied.

25. The recording medium having a program recorded therein according to claim 23, the program causing the computer to further execute the steps of:

determining that a chain effect propagating component is connected halfway through the signal path in said total delay time calculation process, determining whether or not a connection between components that precede and follow said chain effect propagating component is in a connection relation for generating the chain delay effect; and replacing the delay time of the component that follows said chain effect propagating component by the chain delay time in a case in which the connection is in the connection relation for generating the chain delay effect, and replacing the delay time of the component that follows said chain effect propagating component by the delay time of the discrete component in a case in which the connection is not in the connection relation for generating the chain delay effect.

26. The recording medium including a program recorded therein according to claim 23, wherein said chain effect propagating component is a component for inputting and outputting signals via a bus.

27. The recording medium including a program recorded therein according to claim 23, wherein:

said chain effect propagating component includes multiple paths leading from an input to an output and has a property to propagate or not to propagate the chain delay effect for each of said multiple paths; and said chain effect propagating component information includes information about whether or not to propagate the chain delay effect for each of said multiple paths of said chain effect propagating component.

* * * * *